(12) United States Patent
Murakami

(10) Patent No.: US 7,172,925 B2
(45) Date of Patent: Feb. 6, 2007

(54) METHOD FOR MANUFACTURING PRINTED WIRING BOARD

(75) Inventor: Keiichi Murakami, Komaki (JP)

(73) Assignee: Noda Screen Co., Ltd., Aichi (JP)

( * ) Notice: Subject to any disclaimer, the term of this patent is extended or adjusted under 35 U.S.C. 154(b) by 0 days.

(21) Appl. No.: 10/537,994

(22) PCT Filed: Dec. 12, 2002

(86) PCT No.: PCT/JP02/12843

§ 371 (c)(1),
(2), (4) Date: Jun. 9, 2005

(87) PCT Pub. No.: WO2004/054337

PCT Pub. Date: Jun. 24, 2004

(65) Prior Publication Data

US 2006/0148126 A1    Jul. 6, 2006

(51) Int. Cl.
*H01L 21/00* (2006.01)
*H05K 7/02* (2006.01)
*B05D 5/12* (2006.01)
(52) U.S. Cl. ............... 438/107; 361/777; 174/255; 427/96.1
(58) Field of Classification Search ........... 174/255; 438/106, 107; 361/720, 748, 777; 427/96.1
See application file for complete search history.

(56) References Cited

U.S. PATENT DOCUMENTS

| | | | |
|---|---|---|---|
| 6,739,040 B1 * | 5/2004 | Nakamura et al. | 29/830 |
| 2005/0258522 A1 * | 11/2005 | En et al. | 257/670 |
| 2006/0037193 A1 * | 2/2006 | Enomoto et al. | 29/830 |
| 2006/0115582 A1 * | 6/2006 | Murakami | 427/96.1 |

FOREIGN PATENT DOCUMENTS

| | | |
|---|---|---|
| JP | 3-34494 | 2/1991 |
| JP | 8-293673 | 11/1996 |
| JP | 9-116264 | 5/1997 |
| JP | 10-242621 | 9/1998 |
| JP | 2000-332387 | 11/2000 |

* cited by examiner

*Primary Examiner*—W. David Coleman
(74) *Attorney, Agent, or Firm*—Wenderoth, Lind & Ponack, L.L.P.

(57) ABSTRACT

There is provided a method for manufacturing a flat printed wiring board in which spaces between circuit patterns are filled with a resin. The method comprises: laminating via a mold release film a plurality of sets of laminated bodies formed by superposing a semi-cured resin sheet on a printed wiring board with circuit patterns formed thereon; placing the laminated plural sets of the laminated bodies interposed between a pair of smoothing plates and collectively pressing the laminated bodies in a reduced pressure atmosphere used for curing the resin; and then polishing the cured resin covering the circuit patterns, thereby exposing the circuit patterns.

17 Claims, 5 Drawing Sheets

METHOD FOR MANUFACTURING PRINTED WIRING BOARD

TECHNICAL FIELD

The present invention relates to a method for manufacturing a flat printed wiring board in which spaces between circuit patterns are filled with a resin.

BACKGROUND ART

In the case of manufacturing a multilayer printed wiring board by e.g. a build-up method, it is necessary to flatten the surface of a lower layer substrate in order to increase the wiring density. However, the circuit patterns of a printed wiring board may be manufactured by a subtractive method for removing unnecessary parts of copper foil via etching. As a result, the printed wiring boards are generally formed into an uneven configuration. The part representing the circuit pattern typically rises above the surrounding surface of the base material.

Therefore, in order to flatten a printed board in which the surface is formed in an uneven form as described above the following method has been proposed. The method comprises laminating a semi-cured resin sheet onto circuit patterns; pressing the resin sheet in a reduced pressure atmosphere so as to have the resin fill in the spaces between the circuit patterns, and curing the resin; and polishing the cured resin covering the circuit patterns; in order to obtain a smoothed substrate with exposed circuit patterns.

Heretofore, a laminating press has generally been utilized for manufacturing a multilayer substrate by pressing a laminated body. The laminated body is formed by laminating a prepreg and a metallic foil, etc., onto an uneven core substrate on which circuit patterns are formed. In the laminating press, which is intended for making a multilayered substrate (i.e. for laminating an insulation layer onto the circuit patterns), there has been a condition in which the pressing must be performed while adjusting the pressing pressure and the pressing amount (i.e., distance), etc., in order to make the insulating layer on the circuit patterns have a predetermined thickness. In the above described circumstances, the pressing condition may be so demanding that it is difficult to collectively press a plurality of sets of laminated bodies. More specifically, in the case where a plurality of sets of laminated bodies are arranged to be collectively pressed in order to form a number of individual laminated bodies with a predetermined thickness, various conditions such as the pressing pressure and the heat transfer rate in each laminated body need to be made uniform across the whole group of laminated bodies. To this end, smoothing plates must be arranged between respective laminated bodies. Accordingly, a configuration for performing collective pressing via the arranging of smoothing plates between respective laminated bodies has been generally adopted in the art of laminated pressing.

However, the above described method of performing collective pressing by arranging smoothing plates between respective laminated bodies has a problem in that the number of laminated bodies that can be received by a pressing machine with a fixed width is reduced by the thickness of the plurality of smoothing plates. As a result, the productivity level of the laminating press is lowered.

The present invention has been made in view of the above described circumstances. An object of the present invention is to provide a method for manufacturing a flat printed wiring board and with a relatively excellent level of productivity.

DISCLOSURE OF THE INVENTION

In order to solve the above described problem, according to the present invention there is provided a method for manufacturing a flat printed wiring board in which the spaces between circuit patterns are filled with a resin. The method comprises: laminating a plurality of sets of laminated bodies, in which the sets of laminated bodies are formed by superposing a semi-cured resin sheet onto a printed wiring board with circuit patterns formed thereon, via a mold release film; placing the laminated plural sets of laminated bodies so as to be interposed between a pair of smoothing plates and then pressing the laminated plural sets of laminated bodies in a reduced pressure atmosphere in order to cure the resin; and then polishing the cured resin covering the circuit patterns, thereby exposing the circuit patterns.

The circuit patterns may be formed on both sides of the printed wiring board. A metallic foil with a roughened surface facing the resin layer may also be superposed on the resin layer. In this case, the metallic foil may be formed from a different type of metal than the type of metal of the circuit pattern.

The object of the present invention is not to make a multilayered substrate by forming an insulating layer on circuit patterns as in the conventional case, but to provide a flat substrate with exposed circuit patterns by filling the spaces between the circuit patterns with resin. Accordingly, the adjustment of the thickness of the resin layer on the circuit patterns is not required. The resin only needs to be pressed to the very limit of the height of the circuit patterns so as to leave as little resin as possible on the circuit patterns and to fill the resin into the spaces between the circuit patterns. As a result, a pair of smoothing plates only needs to be arranged on the outermost parts of the plurality of sets of laminated bodies. In this way, by reducing the number of smoothing plates at the time of pressing it is possible to increase the number of laminated bodies received in a pressing machine having a predetermined width. It is also possible to improve the thermal circulation at the time of heating. Consequently, the productivity can be greatly improved. Further, a similar operating effect can also be obtained even when the above described circuit patterns are formed on both sides of a substrate.

Additionally, a metallic foil with a roughened surface facing the resin may be interposed between the smoothing plate and the resin prior to the time of pressing the smoothing plate against the resin on the substrate. This allows the resin to more easily spread thinly and also causes the surface of the resin to be formed in a fine uneven state corresponding to the roughened surface of the metallic foil. As a result, the residual resin layer can be more easily polished.

Still further, in the case where the metallic foil interposed between the smoothing plate and the resin is formed with a different kind of metal from the kind of metal used in the circuit patterns, the metal foil may be removed by selective etching. The selective etching may be used to only dissolve the metallic foil without affecting the metal of the circuit patterns.

BEST MODE FOR CARRYING OUT THE INVENTION

Figure 1:
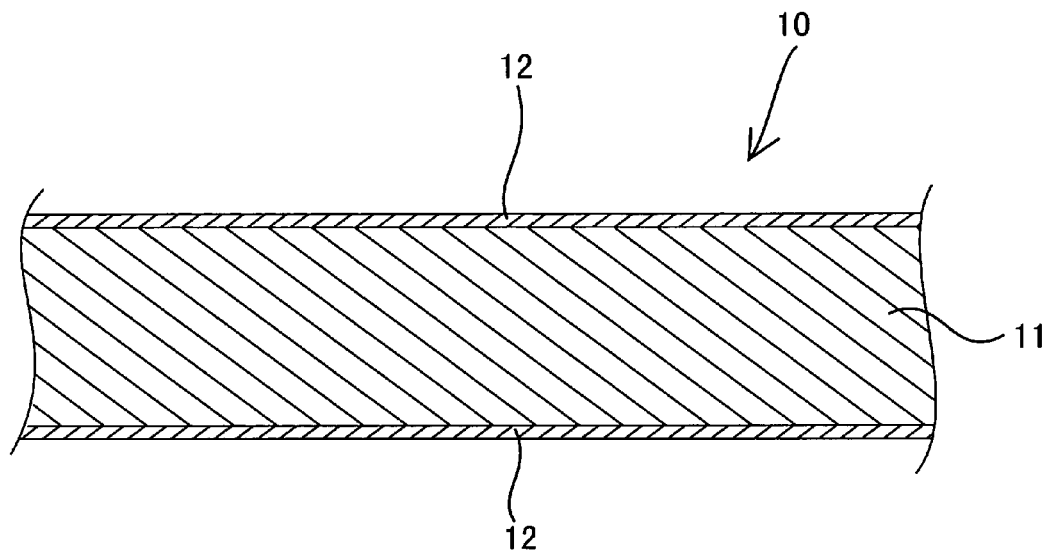
FIG. 1 is a sectional view of a copper clad laminated board.
Figure 2:
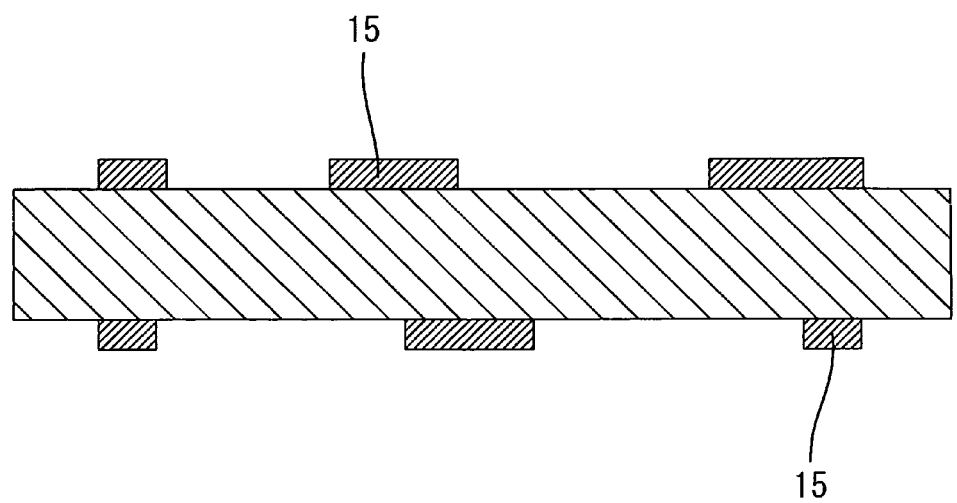
FIG. 2 is a sectional view of the wiring board with circuit patterns formed thereon.

In the present embodiment, as shown in FIG. 1, a copper clad laminated board 10 is used as a base material in which copper foils 12 are adhered to both sides of a glass epoxy substrate 11 with a thickness of 100 µm to 3000 µm. Circuit patterns 15 are formed on the copper clad laminated board 10 by a known photoetching method (see FIG. 2).

Figure 3:
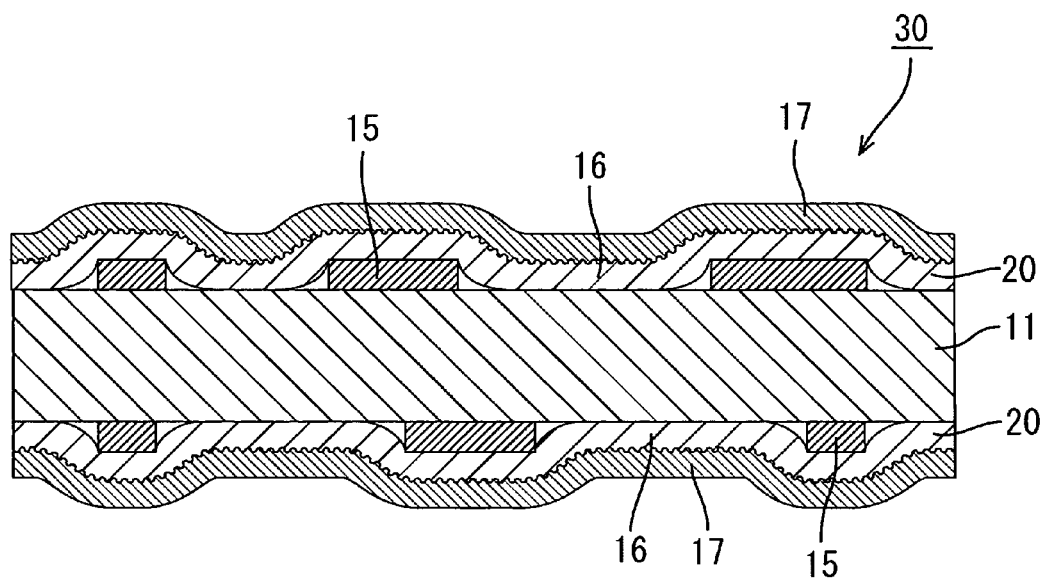
FIG. 3 is a sectional view of a wiring board on which resin layers are formed with resin sheets according to an embodiment of the present invention.

Next, as shown in FIG. 3, resin layers 16 are formed on the substrate by laminating resin sheets 20 with a thickness of about 30 µm, which are formed by e.g. semi-cured thermosetting epoxy resin, onto the circuit patterns 15 of the wiring board. On the resin sheets 20, nickel foils 17, having a thickness of 18 µm and one face of which is roughened by a needle shaped plating, are also laminated beforehand such that the roughened surface faces the resin sheet 20. At this time, minute air bubbles may also be contained in the resin layer 16. Additionally, the surface of the resin layers 16 is in a gradually rising/falling (i.e., undulating) state as the surface of the resin layers 16 pass over the raised part of the circuit patterns 15. Thirteen sets of laminated bodies 30 as described above are prepared and superposed via the intermediary of Tedlar 31 as a mold release film.

Figure 4:
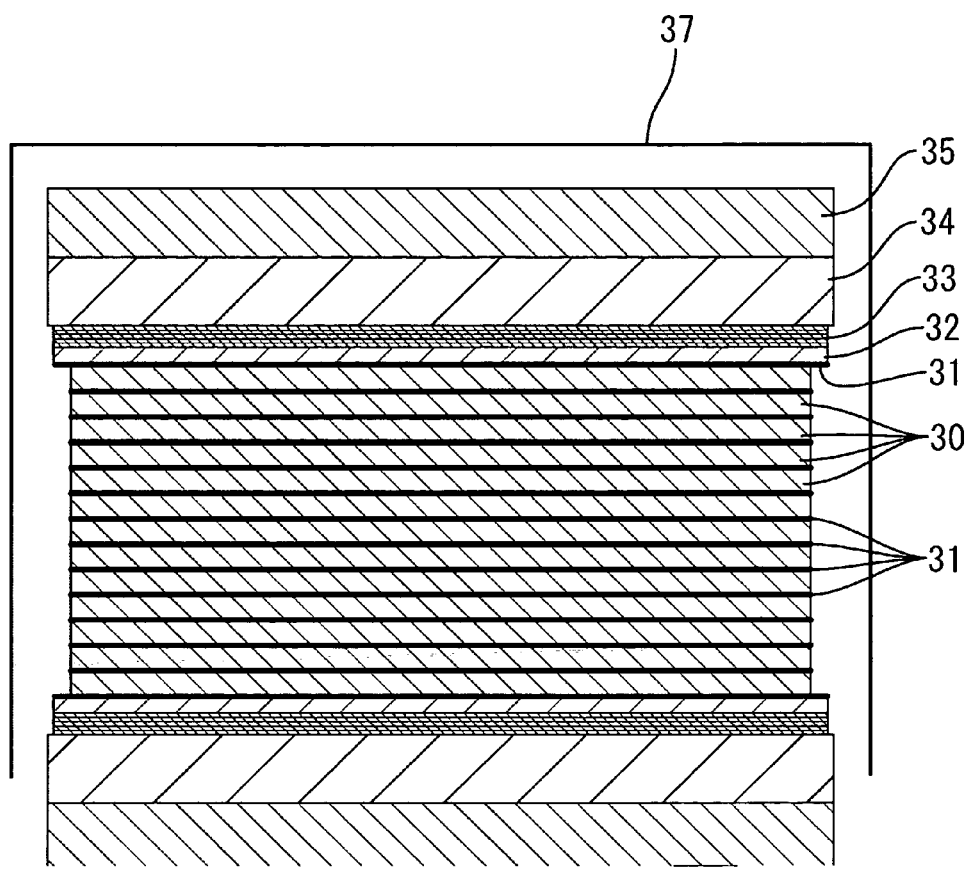
FIG. 4 is a schematic view of a layout at the time of vacuum pressing.

Next, as shown in FIG. 4, a pair of mirror surface plates 32 with a thickness of about 1 mm are arranged via Tedlars 31 at the outermost parts of the thirteen sets of laminated bodies 30. On the mirror surface plates 32, kraft papers 33 (e.g., with a thickness of 0.25 mm×5 sheets) as a cushioning material, stainless jig plates 34 (e.g., with a thickness of 4 or 5 mm) and top boards 35 (e.g., with a thickness of 4 mm) as heat insulating materials, are respectively laminated in this sequence. The entire assembly of materials is placed on a carrier plate so as to be covered by a cap 37. After having been thusly arranged, the assembly of materials including the carrier plate and the cap 37 are then placed at a predetermined position in a pressing machine in order to be pressed at a pressure of approximately 30 kg/cm² in a reduced pressure atmosphere. As a result, the surface of the resin layers 16, which is in a gradually rising/falling state, is compressed. The resin on the circuit patterns 15 is moved so as to fill the spaces between the circuit patterns. As a result, the substrate as a whole is flattened. The air bubbles in the resin layers 16 rise up to the vicinity of the surface of the resin layers 16 so as to be removed from inside of the resin.

After the resin layers 16 on the circuit patterns 15 are sufficiently compressed and the air bubbles in the resin are fully released to the outside, the resin layers 16 are heated so as to be finally cured.

Figure 5:
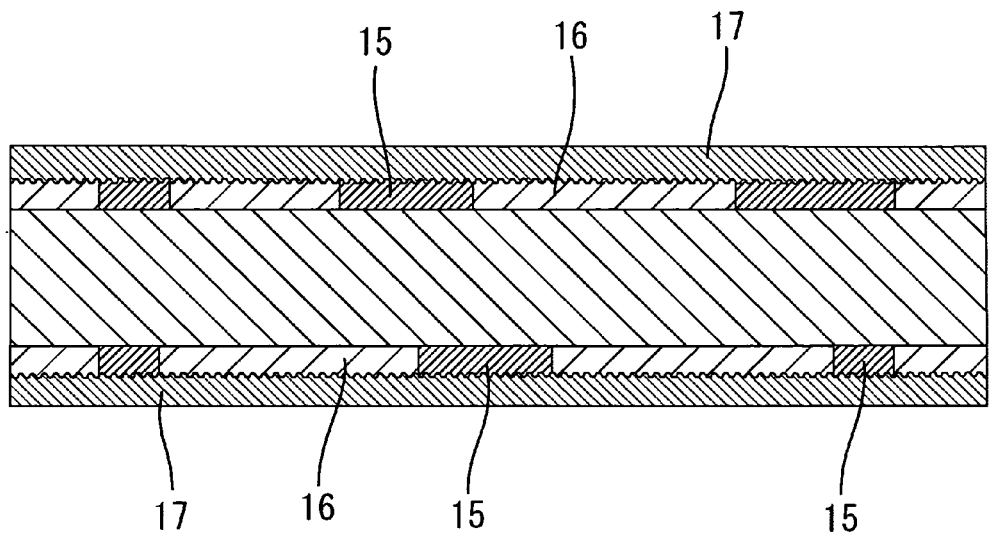
FIG. 5 is a sectional view of the wiring board after the resin is cured.
Figure 6:
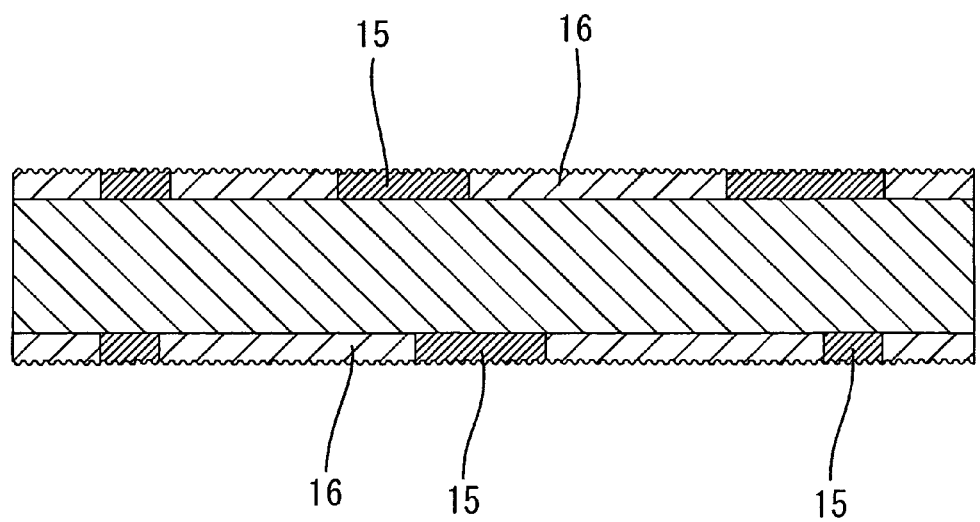
FIG. 6 is a sectional view of the wiring board after the metallic foils are removed.
Figure 7:
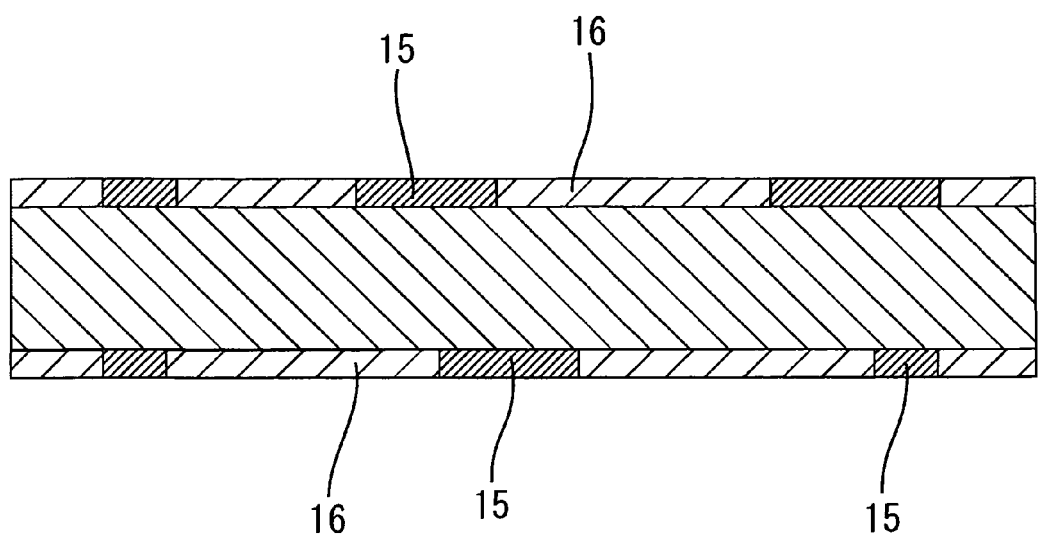
FIG. 7 is a sectional view of the wiring board after polishing.

When the resin is completely cured, the carrier plate is carried out from the pressing machine and the laminated bodies 30 are removed. The nickel foils 17 adhered to the surfaces of the resin layers 16 of each laminated body 30 are then removed by an etching solution used exclusively for nickel (see FIGS. 5 and 6). As a result, the thickness of the resin layers remaining on the copper circuit patterns 15 becomes 10 µm or less and the surface of the resin is in a roughened state. In order to flatten the substrate, primary smooth surface polishing is performed by ceramic buff polishing to remove the resin layers 16 from the circuit patterns 15. Secondary finish polishing is then performed by a surface grinding machine in order to bring the average roughness accuracy of the surface to become equal to or less than 3 µm (see FIG. 7). In the case of surface polishing, since the resin layers 16 remaining on the circuit patterns 15 have an extremely thin thickness (e.g., such as 10 µm) and the surface of the resin layers is roughened, the surface polishing is easily performed.

In this way, according to the present embodiment, a flat printed wiring board with exposed circuit patterns can be manufactured with good level of productivity.

The present invention is not to be limited to the embodiments described above with reference to the drawings. For example, the following embodiments are also considered as included within the scope of the present invention. In addition, further variations other than the following embodiments are possible within the scope and spirit of the invention.

(1) In the above described embodiment, the circuit patterns are formed by the subtractive method. However, the circuit patterns may also be formed by an additive method.

(2) In the above described embodiment, a thermosetting epoxy resin is used as the material of the resin layers, but the embodiment is not limited to this material. A thermosetting resin, such as a urea resin, a melamine resin, a phenol resin, an acrylic resin, and an unsaturated polyester resin may also be used.

(3) In the above described embodiment, nickel is used as the metallic foil material, but the embodiment is not limited to this material. Other metals such as copper may also be used.

As described above, according to the present invention a flat printed wiring board with exposed circuit patterns can be manufactured with a good level of productivity.

The invention claimed is:

1. A method for manufacturing a flat printed wiring board in which spaces between circuit patterns are filled with a resin, said method comprising the following steps:
    providing a printed wiring board having circuit patterns formed thereon;
    laminating via a mold release film a plurality of sets of laminated bodies formed by superposing a semi-cured resin sheet on said circuit patterns of said printed wiring board;
    placing the laminated plural sets of said laminated bodies interposed between a pair of smoothing plates;
    collectively pressing said laminated bodies in a reduced pressure atmosphere;
    curing said resin; and
    polishing said cured resin covering said circuit patterns, thereby exposing said circuit patterns.

2. The method for manufacturing the flat printed wiring board according to claim 1, wherein said circuit patterns are formed on both sides of said printed wiring board.

3. The method for manufacturing the flat printed wiring board according to claim 1 wherein said circuit patterns are formed by an additive method.

4. The method for manufacturing the flat printed wiring board according to claim 1, including a further step of superposing a metallic foil with a roughened surface facing said resin layer onto said resin layer.

5. The method for manufacturing the flat printed wiring board according to claim 2, including a further step of superposing a metallic foil with a roughened surface facing said resin layer onto said resin layer.

6. The method for manufacturing the flat printed wiring board according to claim 5, wherein said metallic foil is formed with a different kind of metal than the kind of metal used to form said circuit pattern.

7. The method for manufacturing the flat printed wiring board according to claim 5 wherein the step of polishing comprises the steps of:
ceramic buff polishing to remove resin layers from the circuit pattern; and
finish polishing to reduce the average roughness of the surface of the flat printed wiring board.

8. The method for manufacturing the flat printed wiring board according to claim 6, wherein said metallic foil is nickel.

9. The method for manufacturing the flat printed wiring board according to claim 4, wherein said metallic foil is formed with a different kind of metal than the kind of metal used to form said circuit pattern.

10. A method for manufacturing a flat printed wiring board in which spaces between circuit patterns are filled with a resin, said method comprising the following steps:
providing a printed wiring board having said circuit patterns formed thereon;
laminating a semi-cured resin sheet on said circuit patterns of said printed wiring board to form a board assembly;
stacking a predetermined number of said board assemblies with a mold release film interposed between every adjacent said board assembly to create a stack of board assemblies;
superposing a first smoothing plate on a first surface of said stack of board assemblies via a first mold release film;
superposing a second smoothing plate on a second surface of said stack of board assemblies via a second mold release film;
pressing said first and second smoothing plates and said stack of board assemblies in a reduced atmosphere environment;
heating said stack of board assemblies so as to cure the semi-cured resin sheets;
polishing each board assembly so as to expose each corresponding said circuit pattern.

11. The method for manufacturing the flat printed wiring board according to claim 10, wherein said printed wiring board of said board assembly comprises a first board surface and a second board surface, and
wherein said circuit pattern is printed on said first board surface, and
wherein a second circuit pattern is printed on said second board surface, and
wherein a second semi-cured resin sheet is superposed on said second circuit pattern, and
wherein each board assembly is further polished to expose each corresponding second circuit pattern.

12. The method for manufacturing the flat printed wiring board of claim 11 further comprising the steps of:
superposing a metallic foil with a roughened surface onto said semi-cured resin sheet wherein the roughened surface contacts said semi-cured resin sheet, and
superposing a second metallic foil with a second roughened surface onto said second semi-cured resin sheet wherein the second roughened surface contacts said second semi-cured resin sheet.

13. A method for manufacturing a flat printed wiring board comprising the steps of:
stacking a semi-cured resin sheet on each surface of a printed wiring board comprising a printed circuit pattern;
stacking a metallic foil with a roughened surface onto each of the semi-cured resin sheets wherein the roughened surface contacts the corresponding semi-cured resin sheet;
stacking a predetermined number of the printed wiring boards comprising said corresponding semi-cured resin sheets, said corresponding metallic foils, and said corresponding circuit patterns, wherein adjacent printed wiring boards are separated by a corresponding mold release film and additional said corresponding mold release films are also placed over a first end and a second end of said stack of printed wiring boards;
placing said stack of printed wiring boards and said corresponding mold release films between a first smoothing plate and a second smoothing plate;
compressing said first smoothing plate and said second smoothing plate and said corresponding stack of printed wiring boards and said corresponding mold release films in a reduced pressure environment so as to reduce a thickness of each of a combination of printed wiring board and corresponding semi-cured resin sheets;
heating said stack of printed wiring boards so as to cure each said corresponding semi-cured resin sheets;
removing said corresponding metallic foils from each printed wiring board;
polishing each printed wiring board to expose said corresponding circuit patterns.

14. The method for manufacturing the flat printed wiring board of claim 13, wherein said printed circuit pattern comprises:
a first printed circuit pattern printed on a first surface of the printed wiring board; and
a second printed circuit pattern printed on a second surface of the printed wiring board.

15. The method for manufacturing the flat printed wiring board of claim 14, wherein said first printed circuit pattern and said second printed circuit pattern are respectively formed by a subtractive method.

16. The method for manufacturing the flat printed wiring board of claim 14, wherein a thermosetting epoxy resin is used as a material of said semi-cured resin sheets.

17. The method for manufacturing the flat printed wiring board of claim 14, wherein a thermosetting resin is used as a material of said semi-cured resin sheets.

* * * * *

UNITED STATES PATENT AND TRADEMARK OFFICE
CERTIFICATE OF CORRECTION

PATENT NO. : 7,172,925 B2 Page 1 of 1
APPLICATION NO. : 10/537994
DATED : February 6, 2007
INVENTOR(S) : Keiichi Murakami It is certified that error appears in the above-identified patent and that said Letters Patent is hereby corrected as shown below:

On Title Page Item (22), please change "December 12, 2002" to --December 9, 2002--.

Signed and Sealed this

Twenty-ninth Day of May, 2007

JON W. DUDAS
*Director of the United States Patent and Trademark Office*